United States Patent
Yasuda et al.

(10) Patent No.: US 10,204,980 B2
(45) Date of Patent: Feb. 12, 2019

(54) SEMICONDUCTOR DEVICE AND MANUFACTURING METHOD OF THE SAME

(71) Applicants: TOYOTA JIDOSHA KABUSHIKI KAISHA, Toyota-shi, Aichi-ken (JP); DENSO CORPORATION, Kariya-shi, Aichi-ken (JP)

(72) Inventors: Yoshifumi Yasuda, Nagoya (JP); Tatsuji Nagaoka, Nagakute (JP); Yasushi Urakami, Kariya (JP); Sachiko Aoi, Nagakute (JP)

(73) Assignees: TOYOTA JIDOSHA KABUSHIKI KAISHA, Toyota (JP); DENSO CORPORATION, Kariya (JP)

( * ) Notice: Subject to any disclaimer, the term of this patent is extended or adjusted under 35 U.S.C. 154(b) by 14 days.

(21) Appl. No.: 15/602,741

(22) Filed: May 23, 2017

(65) Prior Publication Data

US 2018/0019301 A1 Jan. 18, 2018

(30) Foreign Application Priority Data

Jul. 14, 2016 (JP) .................................. 2016-139552

(51) Int. Cl.
| | |
|---|---|
| H01L 21/26 | (2006.01) |
| H01L 29/06 | (2006.01) |
| H01L 29/41 | (2006.01) |
| H01L 29/66 | (2006.01) |
| H01L 21/265 | (2006.01) |
| H01L 29/417 | (2006.01) |

(Continued)

(52) U.S. Cl.
CPC ...... H01L 29/0619 (2013.01); H01L 21/0465 (2013.01); H01L 21/26513 (2013.01);
(Continued)

(58) Field of Classification Search
CPC ........... H01L 21/0465; H01L 21/26513; H01L 21/26586; H01L 29/0619; H01L 29/0688;
(Continued)

(56) References Cited

U.S. PATENT DOCUMENTS

| | | | | |
|---|---|---|---|---|
| 2003/0218220 A1* | 11/2003 | Takahashi | ........... | H01L 29/0619 257/409 |
| 2009/0212301 A1* | 8/2009 | Zhang | ................. | H01L 29/0619 257/77 |
| 2017/0040441 A1* | 2/2017 | Aoi | ..................... | H01L 29/7802 |

FOREIGN PATENT DOCUMENTS

| | | |
|---|---|---|
| JP | 2008-10506 A | 1/2008 |
| JP | 2013-105798 A | 5/2013 |

(Continued)

*Primary Examiner* — Lynne Gurley
*Assistant Examiner* — Vernon P Webb
(74) *Attorney, Agent, or Firm* — Oliff PLC

(57) ABSTRACT

A semiconductor device may include an element region and a peripheral voltage withstanding region. The peripheral voltage withstanding region includes inner circumferential guard rings; and outer circumferential guard rings having a width narrower than a width of the inner circumferential guard rings. An interval between the inner circumferential guard rings is narrower than an interval between the outer circumferential guard rings. Each of the inner circumferential guard rings includes a first high concentration region and a first low concentration region. Each of the outer circumferential guard rings includes a second high concentration region and a second low concentration region. A width of a part of each first low concentration region that is exposed on a front surface of the semiconductor device is wider than a width of a part of each second low concentration region that is exposed on the front surface.

3 Claims, 8 Drawing Sheets

(51) Int. Cl.
  *H01L 29/872*  (2006.01)
  *H01L 29/16*   (2006.01)
  *H01L 21/04*   (2006.01)
  *H01L 29/739*  (2006.01)
  *H01L 29/78*   (2006.01)
  *H01L 29/861*  (2006.01)

(52) U.S. Cl.
  CPC .... *H01L 21/26586* (2013.01); *H01L 29/0688* (2013.01); *H01L 29/0692* (2013.01); *H01L 29/1608* (2013.01); *H01L 29/417* (2013.01); *H01L 29/66143* (2013.01); *H01L 29/872* (2013.01); *H01L 29/6606* (2013.01); *H01L 29/66136* (2013.01); *H01L 29/66333* (2013.01); *H01L 29/66712* (2013.01); *H01L 29/7395* (2013.01); *H01L 29/7811* (2013.01); *H01L 29/861* (2013.01)

(58) Field of Classification Search
  CPC ............. H01L 29/0692; H01L 29/1608; H01L 29/417; H01L 29/66
  USPC ......................................... 257/480–484, 492
  See application file for complete search history.

(56) References Cited

FOREIGN PATENT DOCUMENTS

| | | |
|---|---|---|
| JP | 2013-168549 A | 8/2013 |
| JP | 5324603 B2 | 10/2013 |

\* cited by examiner

US 10,204,980 B2

SEMICONDUCTOR DEVICE AND MANUFACTURING METHOD OF THE SAME

TECHNICAL FIELD

A technique disclosed herein relates to a semiconductor device and a manufacturing method of the semiconductor device.

BACKGROUND

Japanese Patent Application Publication No. 2013-468549 discloses a semiconductor device including a diode. This semiconductor device has a semiconductor substrate, a front surface electrode, and a rear surface electrode. The front surface electrode covers substantially a center portion of a front surface of the semiconductor substrate. The rear surface electrode covers an entire range of a rear surface of the semiconductor substrate. The diode is formed in a region (hereafter, "element region") of the semiconductor substrate interposed between the front surface electrode and the rear surface electrode. Upon when the diode turns on, current flows from the front surface electrode toward the rear surface electrode. The semiconductor substrate includes an outer circumferential voltage withstanding region around the element region (i.e., between the element region and an outer circumferential end surface of the semiconductor substrate). The outer circumferential voltage withstanding region includes a plurality of p-type guard rings and an n-type outer circumferential drift region. The guard rings are exposed on the front surface of the semiconductor substrate and surround the element region in layers of rings therearound. The outer circumferential drift region separates the guard rings from each other. When the diode has turned off, a potential difference is generated in a lateral direction (direction from an inner circumferential side to an outer circumferential side) in the outer circumferential voltage withstanding region. Then a depletion layer extends from the element region to the outer circumferential drift region. When the depletion layer reaches the guard ring on an innermost side, the depletion layer further extends from that guard ring toward the outer circumferential side. When the depletion layer reaches the second guard ring from the inner circumferential side, the depletion layer further extends from that second guard ring toward the outer circumferential side. As above, the depletion layer extends to the outer circumferential side by way of the respective guard rings. That is, the plurality of guard rings enhances the extension of the depletion layer toward the outer circumferential side in the outer circumferential voltage withstanding region. Due to this, the depletion layer extends broadly in the outer circumferential voltage withstanding region, and reduces electric field in the outer circumferential voltage withstanding region. It should be noted that although the diode is provided in the element region in Japanese Patent Application Publication No. 2013-468549, even when another type of semiconductor element (e.g., MOSFET (abbreviation of Metal-Oxide Semiconductor Field-Effect Transistor) or IGBT (abbreviation of Insulated Gate Bipolar Transistor)) is provided in the element region, the electric field in the outer circumferential voltage withstanding region can be reduced by the guard rings.

SUMMARY

As mentioned above, although the electric field in the outer circumferential voltage withstanding region can be reduced by the plurality of guard rings, a further reduction of the electric field in the outer circumferential voltage withstanding region may be further demanded depending on application conditions of a semiconductor device. In a semiconductor device including a plurality of guard rings, high electric field is more prone to be generated in a vicinity of the guard ring(s) on the inner circumferential side (side closer to an element region) than in a vicinity of the guard ring(s) on the outer circumferential side (side closer to an outer circumferential end surface). In regard to this, the present inventors provided a structure in which the guard ring(s) on the inner circumferential side have a greater width (i.e., dimension in a direction from the inner circumferential side toward the outer circumferential side) than the guard ring(s) on the outer circumferential side. According to this structure, an interval between the guard rings on the inner circumferential side can be made narrower than an interval between the guard rings on the outer circumferential side. By making the interval between the guard rings on the inner circumferential side narrower, electric field in the vicinity of the guard rings on the inner circumferential side can be suppressed. However, even if this structure is implemented, higher electric field may happen to be generated in the vicinity of the guard ring(s) on the inner circumferential side than in the vicinity of the guard ring(s) on the outer circumferential side. Therefore, the present disclosure provides a technique that allows electric field in an outer circumferential voltage withstanding region to be further reduced.

A semiconductor device disclosed herein may comprise: a semiconductor substrate; a front surface electrode being in contact with a front surface of the semiconductor substrate; a rear surface electrode being in contact with a rear surface of the semiconductor substrate. The semiconductor substrate may comprise an element region overlapping with a contact surface between the front surface electrode and the semiconductor substrate in a planar view along a thickness direction of the semiconductor substrate and comprising a semiconductor element configured to electrically connect the front surface electrode and the rear surface electrode; and a peripheral voltage withstanding region located around the element region. The peripheral voltage withstanding region may comprise: a plurality of p-type guard rings exposed on the front surface and surrounding the element region in a pattern of layers of rings; and an n-type peripheral drift region separating the plurality of guard rings from each other. The plurality of guard rings may comprise: a plurality of inner circumferential guard rings; and a plurality of outer circumferential guard rings located on an outer circumferential side with respect to the inner circumferential guard rings and having a width narrower than a width of the inner circumferential guard rings. An interval between the inner circumferential guard rings may be narrower than an interval between the outer circumferential guard rings. Each of the inner circumferential guard rings may comprise: a first high concentration region having a p-type impurity concentration that is higher than ten percent of a peak value of a p-type impurity concentration of the inner circumferential guard ring; and a first low concentration region having a p-type impurity concentration that is equal to or less than ten percent of the peak value of the p-type impurity concentration of the inner circumferential guard ring and located between the corresponding first high concentration region and the peripheral drift region. Each of the outer circumferential guard rings comprises: a second high concentration region having a p-type impurity concentration that is higher than ten percent of a peak value of a p-type impurity concentration of the outer circumferential guard ring; and a second low concentration region having a p-type impurity concentration that is equal to or lower than ten percent of the peak value of the p-type impurity concentration of the outer circumferential guard ring and located between the corresponding second high concentration region and the peripheral drift region. A width of a portion of each first low concentration region is wider than a width of a portion of each second low concentration region. The portion of each first low concentration region is exposed on the front surface and adjacent to the corresponding first high concentration region on the outer circumferential side. The portion of each second low concentration region is exposed on the front surface and being adjacent to the corresponding second high concentration region on the outer circumferential side.

It should be noted that the width of the guard rings as used herein means a dimension thereof in a direction from the inner circumferential side (element region side) toward the outer circumferential side (outer circumferential end surface side of the semiconductor substrate). Further, in the present disclosure, the width of the low concentration region means a dimension thereof in the direction from the inner circumferential side toward the outer circumferential side.

The semiconductor device comprises the plurality of inner circumferential guard rings having a greater width and the plurality of outer circumferential guard rings having a narrower width. Further, the interval between the plurality of inner circumferential guard rings is narrower than the interval between the plurality of outer circumferential guard rings. According to this configuration, electric field is reduced in a vicinity of the inner circumferential guard rings. Further, in this semiconductor device, the width of the portion of each first low concentration region, the portion being adjacent to its corresponding high concentration region on the outer circumferential side, and being exposed on the front surface (referred to as "outer circumferential portion" hereinbelow) is greater than the width of an outer circumferential portion of each second low concentration region that is exposed on the front surface. The outer circumferential portion of each low concentration region is depleted when the outer circumferential drift region is depleted. By making the width of the outer circumferential portion of each first low concentration region wide, a region that is depleted in the vicinity of the inner circumferential guard rings is broadened, leading to further reduction of the electric field an the vicinity of the inner circumferential guard rings.

Further, since the outer circumferential guard rings have a narrower width, if the low concentration region having a wide width is to be provided in each outer circumferential guard ring, the width of the high concentration region of each outer circumferential guard ring will be extremely small. In this case, it will be difficult for such outer circumferential guard ring to contribute to development of a depletion layer, and the extension of the deletion layer may become insufficient in the outer circumferential drift region around the outer circumferential guard rings. In this case, electric field being extremely high is generated in the region where the extension of the depletion layer has been insufficient, and a withstanding voltage of the semiconductor device will drastically decrease. Contrary to this, since the semiconductor device disclosed herein has the outer circumferential portion of the low concentration region (second low concentration region) of each outer circumferential guard ring with a narrow width, the width of the high concentration region (second high concentration region) of each outer circumferential guard ring can be sufficiently ensured. Due to this, the depletion layer can be sufficiently developed in the outer circumferential drift region around the outer circumferential guard rings. Thus, the electric field around the outer circumferential guard rings can be reduced.

As described above, according to this semiconductor device, it is possible to suppress high electric field from being generated in both of the vicinity of the inner circumferential guard ring(s) and the vicinity of the outer circumferential guard ring(s). Due to this, according to this semiconductor device, high withstanding voltage can be realized.

DETAILED DESCRIPTION

EMBODIMENTS

Figure 1:
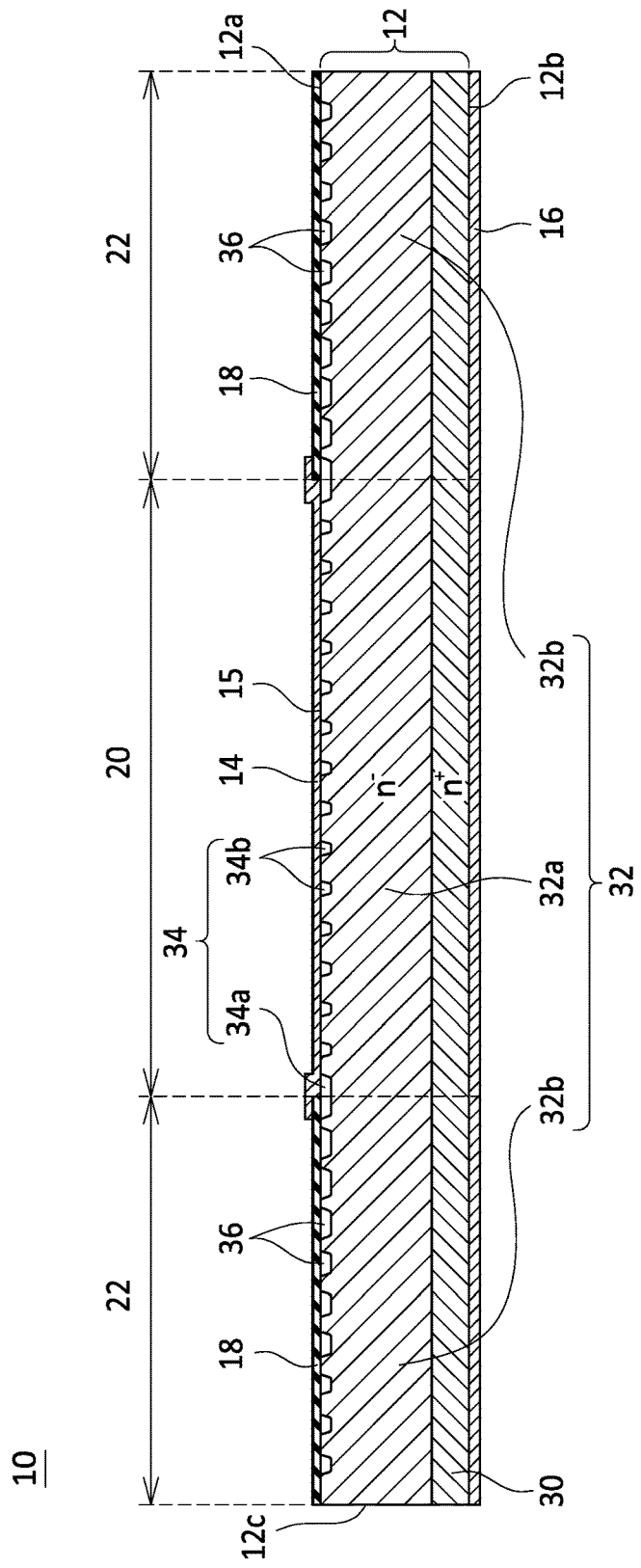
FIG. 1 shows a cross sectional view of a semiconductor device according to an embodiment (cross sectional view taken along line I-I of FIG. 2)
Figure 2:
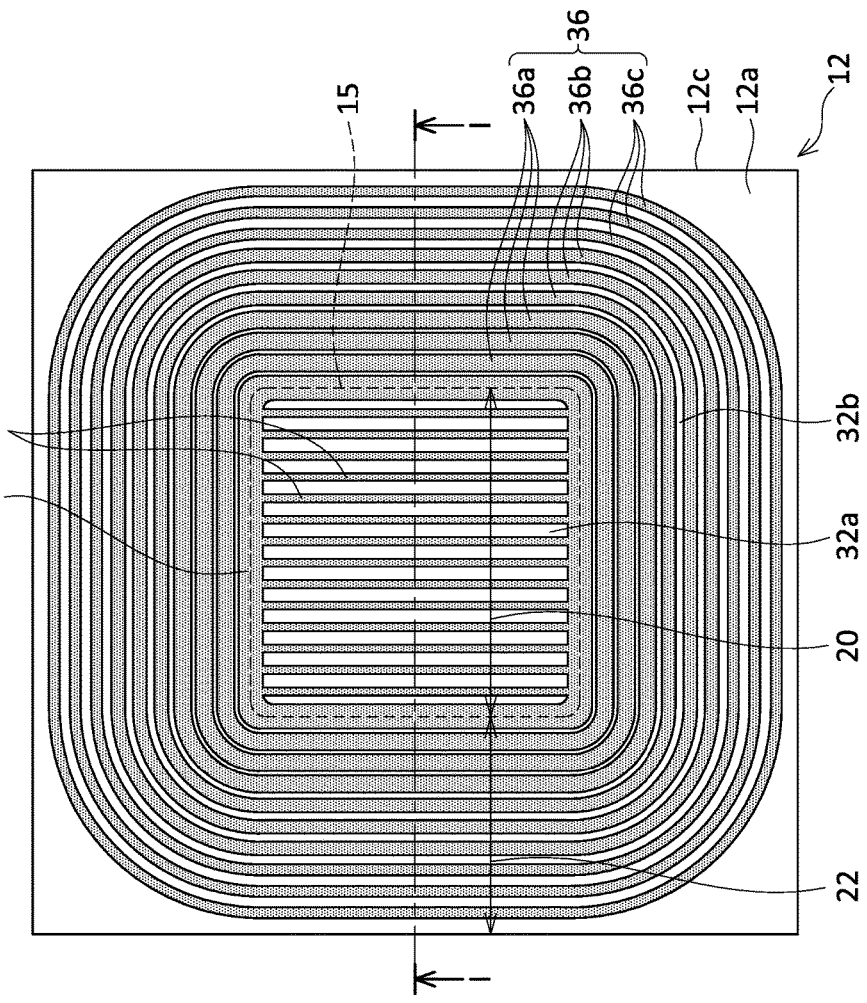
FIG. 2 shows a top view of the semiconductor device according to the embodiment.

A semiconductor device 10 in an embodiment shown in FIGS. 1 and 2 comprises a semiconductor substrate 12. The semiconductor substrate 12 is constituted of a wide gap semiconductor (e.g., SiC). As shown in FIG. 1, an upper electrode 14 and an insulating film 18 are provided on an upper surface 12a. of the semiconductor substrate 12. Notably, in FIG. 2, illustration of the upper electrode 14 and the insulating film 18 is omitted. A dotted line of FIG. 2 indicates a contour of a contact surface 15 where the upper electrode 14 and the semiconductor substrate 12 are in contact with each other. The upper electrode 14 is located in a center portion of the upper surface 12a of the semiconductor substrate 12. A region of the upper surface 12a that is not covered by the upper electrode 14 (i.e., region outside of the contact surface 15) is covered by the insulating film 18. As shown in FIG. 1, a lower electrode 16 is provided on a lower surface 12b of the semiconductor substrate 12. The lower electrode 16 covers an entire range of the lower surface 12b of the semiconductor substrate 12. A region 20 interposed between the upper electrode 14 and the lower electrode 16 (i.e., region 20 overlapping the contact surface 15 as seen along a thickness direction of the semiconductor substrate 12) is an element region that functions as a semiconductor element (Schottky Barrier Diode in the present embodiment). A region in the semiconductor substrate 12 that is outside of the element region 20 (i.e., region between the element region 20 and an outer circumferential end surface 12c of the semiconductor substrate 12) is an outer circumferential voltage withstanding region 22.

As shown in FIG. 1, the semiconductor substrate 12 comprises a cathode region 30, a drift region 32, a main p-type region 34, and a plurality of guard rings 36.

The cathode region 30 is an n-type region having a high n-type impurity concentration.

The cathode region 30 extends across from the element region 20 to the outer circumferential region 22. The cathode region 30 is exposed on the entire range of the lower surface 12b of the semiconductor substrate 12. The cathode region 30 makes an ohmic contact with the lower electrode 16.

The drift region 32 is an n-type region having a low n-type impurity concentration than the cathode region 30. The drift region 32 is disposed on the cathode region 30, and is in contact with the cathode region 30. The drift region 32 extends across from the element region 20 to the outer circumferential voltage withstanding region 22. Hereafter, the drift region 32 within the element region 20 will be denoted as a main drift region 32a, and the drift region 32 within the outer circumferential voltage withstanding region 22 will be denoted as an outer circumferential drift region 32b. The main drift region 32a makes contact with (is continuous with) the outer circumferential drift region 32b.

A region hatched in FIG. 2 indicates a p-type region exposed on the upper surface 12a of the semiconductor substrate 12. In the p-type region exposed on the upper surface 12a, the p-type region positioned within the element region 20 is the main p-type region 34, and the p-type regions positioned within the outer circumferential voltage withstanding region 22 are the guard rings 36.

As shown in FIGS. 1 and 2, the main p-type region 34 is exposed on the upper surface 12a of the semiconductor substrate 12 within the element region 20. The main p-type region 34 includes a ring-shaped region 34a extending in a ring shape and a plurality of stripe regions 34b extending in stripe pattern. The ring-shaped region 34a extends substantially in a square shape at the upper surface 12a of the semiconductor substrate 12. The ring-shaped region 34a includes four sides extending in stripe patterns and curved corners. The ring-shaped region 34a has a greater width than each stripe region 34b. An outer circumferential rim of the contact surface 15 is disposed on the ring-shaped region 34a. The respective stripe regions 34b are disposed on an inner side of the ring-shaped region 34a. The respective stripe regions 34b extend parallel to each other. Both ends of each stripe region 34b are connected to the ring-shaped region 34a. The main p-type region 34 is in contact with the upper electrode 14, The main p-type region 34 may make an ohmic contact with the upper electrode 14, or alternatively may make a Schottky contact with the upper electrode 14.

At each position between the adjacent stripe regions 34b, the main drift region 32a is exposed on the upper surface 12a of the semiconductor substrate 12. At these positions, the main drift region 32a makes a Schottky contact with the upper electrode 14.

Figure 3:
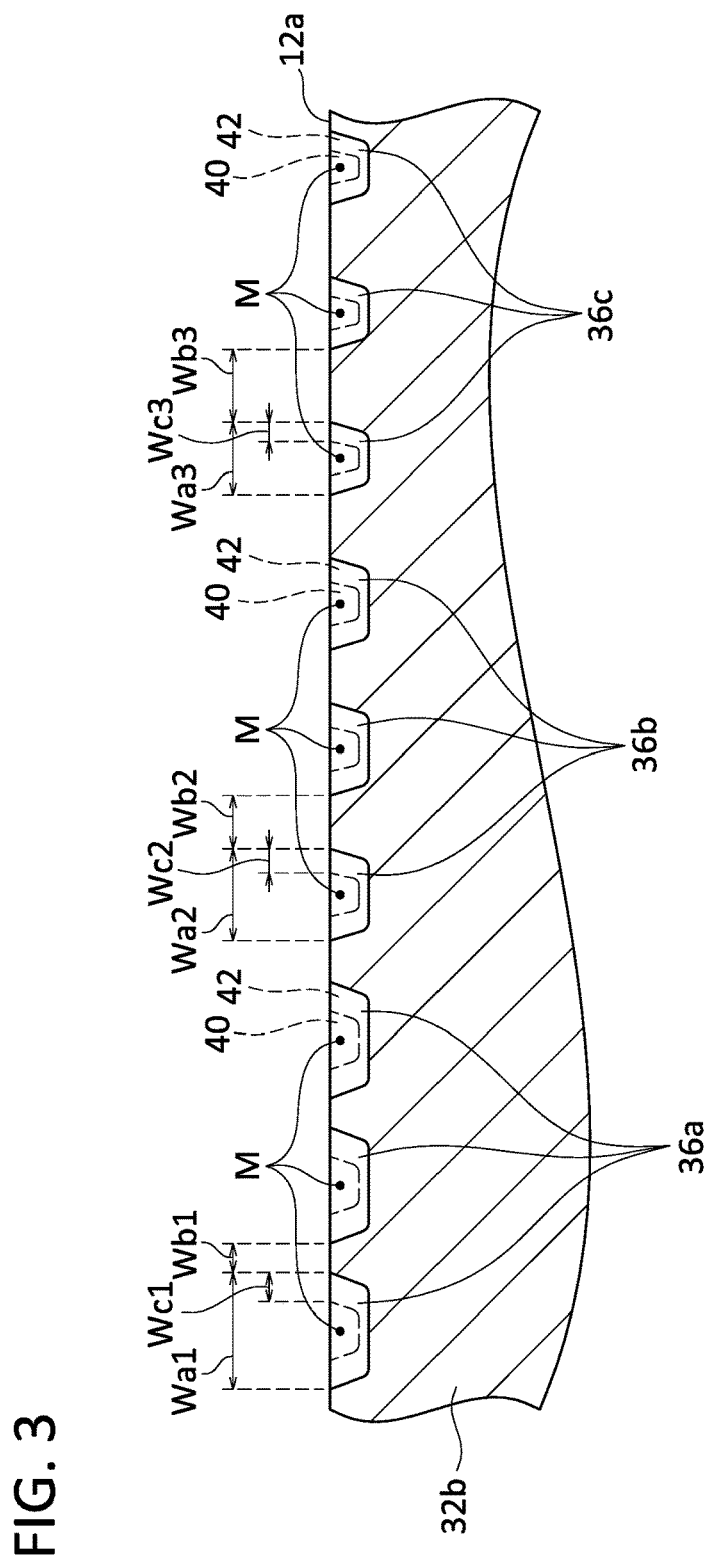
FIG. 3 shows an enlarged cross sectional view of an outer circumferential voltage withstanding region.
Figure 4:
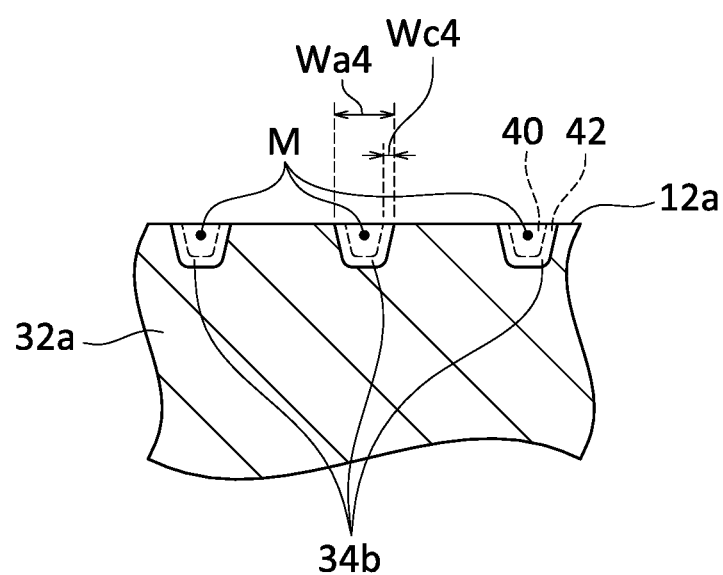
FIG. 4 shows an enlarged cross sectional view of an element region.

As shown in FIGS. 1 and 2, each guard ring 36 is exposed on the upper surface 12a of the semiconductor substrate 12 within the outer circumferential voltage withstanding region 22. As shown in FIG. 2, each guard ring 36 extends in a ring shape in a plan view as seen along the thickness direction of the semiconductor substrate 12. The plurality of guard rings 36 surrounds the element region 20 in layers of rings therearound. The plurality of guard rings 36 includes a plurality of first guard rings 36a, a plurality of second guard rings 36b, and a plurality of third guard rings 36c. FIG. 3 illustrates an enlarged cross sectional view of the guard rings 36. As shown in FIG. 3, a width Wa1 of the first guard rings 36a is greater than a width Wa2 of the second guard rings 36b. The width Wa2 of the second guard rings 36b is greater than a width Wa3 of the third guard rings 36c. It should be noted that the width of each guard ring 36 is a dimension thereof in a direction from the inner circumferential side toward the outer circumferential side. FIG. 4 illustrates an enlarged cross sectional view of the stripe regions 34b. As shown in FIGS. 3 and 4, the width Wa3 of the third guard rings 36c is greater than a width Wa4 of the stripe regions 34b. It should be noted that the width of the stripe regions 34h is a dimension thereof in a direction orthogonal to a direction along which the stripe regions 34b extend (longitudinal direction). As shown in FIG. 2, the plurality of first guard rings 36a is arranged at a position within the outer circumferential voltage withstanding region 22 that is closest to the element region 20. The plurality of second guard rings 36b is arranged on the outer circumferential side of the first guard rings 36a. The plurality of second guard rings 36b surrounds the plurality of first guard rings 36a. The plurality of third guard rings 36c is arranged on the outer circumferential side of the second guard rings 36b. The plurality of third guard rings 36c surrounds the plurality of second guard rings 36b. As shown in FIG. 3, an interval Wb1 between each pair of the adjacent first guard rings 36a is narrower than an interval Wb2 between each pair of the adjacent second guard rings 36b. The interval Wb2 between each pair of the adjacent second guard rings 36b is narrower than an interval Wb3 between each pair of the adjacent third guard rings 36c. As shown in FIG. 3, the respective guard rings 36 have substantially equal depths. Further, as shown in FIGS. 3 and 4, the depth of each guard ring 36 is equal to a depth of each p-type main region 34 (34a, 34b). As shown in FIG. 1, an upper surface of each guard ring 36 is covered by the insulating film 18.

At positions between each pair of the adjacent guard rings 36, the outer circumferential drift region 32b is exposed on the upper surface 12a of the semiconductor substrate 12. The outer circumferential drift region 32b separates the respective guard rings 36 from each other. The outer circumferential drift region 32b separates the respective guard rings 36 from the maim p-type region 34.

The p-type impurity concentration varies depending on positions in the guard rings 36 and the main p-type region 34. As indicated as reference signs M in FIGS. 3 and 4, each of the guard rings 36 and stripe regions 34b comprises a peak point having a highest p-type impurity concentration within itself at a position that is at a center in its width direction and in a vicinity of the upper surface 12a of the semiconductor substrate 12. Within each of the guard rings 36 and stripe regions 34b, the p-type impurity concentration decreases from its corresponding peak point M toward the drift region 32. In the present disclosure, in each of the guard rings 36 and stripe regions 34b, a region having a p-type impurity concentration that is more than, ten percent of the p-type impurity concentration at its corresponding peak point M will be denoted as a high concentration region 40, and a region having a p-type impurity concentration that is equal to or lower than ten percent of the p-type impurity concentration at the corresponding peak point M will be denoted as a low concentration region 42. In each of the guard rings 36 and stripe regions 34b, the high concentration region 40 is distributed around the corresponding peak point M and exposed on the upper surface 12a of the semiconductor substrate 12. In each of the guard rings 36 and stripe regions 34b, the corresponding low concentration region 42 is distributed between the corresponding high concentration region 40 and the drift region 32.

In the present disclosure, a width of a portion of each low concentration region 42 that is exposed on the upper surface 12a will be denoted as a width Wc of the low concentration region 42. As is apparent from FIGS. 3 and 4, each low concentration region 42 is exposed on the upper surface 12a at both sides of the corresponding high concentration region 40. In the present embodiment, in each guard ring 36 as well as in each stripe region 34b, the width of a portion of the low concentration region 42 that is adjacent to its corresponding high concentration region 40 at the outer circumferential side is substantially equal to the width of a portion of the low concentration region 42 that is adjacent to its corresponding high concentration region 40 on the inner circumferential side. The width of the low concentration region 42 in each guard ring 36 is a dimension thereof in the direction, from the inner circumferential side to the outer circumferential side. The width of the low concentration region 42 in each stripe region 34b is a dimension thereof in a direction orthogonal to a direction along which the main p-type region 34 extends (longitudinal direction of the main p-type region 34). As shown in FIG. 3, a width Wc1 of the low concentration region 42 in each first guard ring 36a is greater than a width Wc2 of the low concentration region 42 in each second guard ring 36b. Further, the width Wc2 of the low concentration region 42 in each second guard ring 36b is greater than a width Wc3 of the low concentration region 42 in each third guard ring 36c. As shown in FIGS. 3 and 4, the width Wc3 of the low concentration region 42 in each third guard ring 36c is greater than a width Wc4 of the low concentration region 42 of the main p-type region 34.

Next, an operation of the semiconductor device 10 will be described. In the element region 20 of the semiconductor device 10, a Schottky Barrier Diode (hereafter referred to as SBD) is formed by the upper electrode 14, the main drift region 32a, the cathode region 30, and the lower electrode 16. The upper electrode 14 functions as an anode electrode and the lower electrode 16 functions as a cathode electrode. When a forward voltage (voltage that makes the upper electrode 14 have a higher potential than the lower electrode 16) is applied to between the upper electrode 14 and the lower electrode 16, current flows from the upper electrode 14 to the lower electrode 16 through a Schottky interface between the upper electrode 14 and the main drift region 32a. That is, current flows from the upper electrode 14 to the lower electrode 16 through the main drift region 32a and the cathode region 30. It should be noted that if each region in the main p-type region 34 makes an ohmic contact with the upper electrode 14, the current also flows on a path passing through an interface between each region in the main p-type region 34 and the main drift region 32a. If each region in the main p-type region 34 makes a Schottky contact with the upper electrode 14, the current barely flows on the path passing through the interface between each region in the main p-type region 34 and the main drift region 32a. In either case, the current flows at least on the path passing through the Schottky interface. That is, the SBD is turned on.

Upon switching the voltage applied between the upper electrode 14 and the lower electrode 16 from the forward voltage to reverse voltage (voltage that makes the lower electrode 16 have a higher potential than the upper electrode 14), the current stops and the SBD is turned off. Then, the reverse voltage is applied to the Schottky interface between the upper electrode 14 and the main drift region 32a, thus a depletion layer spreads from the Schottky interface to the main drift region 32a. Further, since the reverse voltage is also applied to a pn junction at the interface between the main p-type region 34 and the main drift region 32a, a depletion layer spreads from the main p-type region 34 to the main drift region 32a. The depletion layer extending from the main p-type region 34 causes the main drift region 32a in ranges sandwiched between the adjacent stripe regions 34b to be quickly pinched off. Due to this, the SBD has a fast turn off speed. Thereafter, the depletion layer spreads substantially over an entire range of the main drift region 32a. The depletion of the main drift region 32a causes a potential difference in the main drift region 32a. Since the main drift region 32a is interposed in a vertical direction between the upper electrode 14 and the lower electrode 16, the potential difference is generated in the depleted main drift region 32a in the vertical direction. A potential difference is barely generated in a lateral direction in the depleted main drift region 32a.

Further, when the reverse voltage is applied between the upper electrode 14 and the lower electrode 16, a depletion layer extends from the ring-shaped region 34a to the outer circumferential drift region 32b. When the depletion layer extending from the ring-shaped region 34a reaches the guard ring 36 on an innermost side, the depletion layer further extends from that guard ring 36 toward the outer circumferential side. When the depletion layer from the guard ring 36 on the innermost side reaches a second guard ring 36 from the innermost side, the depletion layer further extends from that second guard ring 36 toward the outer circumferential side. Thus, in the outer circumferential voltage withstanding region 22, the depletion layer extends toward the outer circumferential side by way of the plurality of guard rings 36. That is, each guard ring 36 enhances the extension of the depletion layer toward the outer circumferential side. The depletion layer extends to a vicinity of the outer circumferential end surface 12c of the semiconductor substrate 12.

Notably, when the depletion layer extends to the outer circumferential drift region 32b, voltage is applied to pn junctions constituting end surfaces on the outer circumferential side of the respective guard rings 36. Due to this, in each guard ring 36, the low concentration region 42 is depleted at a vicinity of its corresponding pn junction constituting the end surface of the guard ring 36. That is, the portion of each low concentration region 42 that is adjacent to the corresponding high concentration region 40 on the outer circumferential side is depleted.

Generally, amounts of fixed charges are balanced between the depletion layers at both sides of a pn junction (depletion layer depleting the n-type region and depletion layer depleting the p-type region). Due to this, the depletion layer extends from the pn junction to an n-type region side by a greater degree as a p-type impurity concentration of the p-type region forming the pn junction becomes higher. Further, the depletion layer extends to the n-type region side by a greater degree as a size of a region having the high p-type impurity concentration becomes greater. In the present embodiment, since the respective low concentration regions 42 in the guard rings 36 each have a low p-type impurity concentration, each low concentration region 42 barely contributes to the extension of the corresponding depletion layer to the outer circumferential drill region 32b. Due to this, the size of the high concentration region 40 in each guard ring 36 affects the extension of the depletion layer to the outer circumferential drill region 32b. As mentioned above, the widths of the guard rings 36 become narrower from the inner circumferential side to the outer circumferential side (width. Wa1>width Wa2>width Wa3).

In connection to this, the widths of the low concentration regions 42 become narrower from the inner circumferential side to the outer circumferential side (width Wc1>width Wc2>width Wc3). Due to this, even in the narrow third guard rings 36c on the outer circumferential side, the width of their high concentration regions 40 is not significantly narrow. Therefore, even the narrow third guard rings 36c on the outer circumferential side can sufficiently enhance the extension of the depletion layer to the outer circumferential drift region 32b. Due to this, the extension of the depletion layer remains sufficient around the narrow third guard rings 36c. Therefore, high electric field may be prevented from being generated in vicinity of the third guard rings 36c.

Further, as mentioned above, in the outer circumferential voltage withstanding region 22, when the reverse voltage is applied, the depletion layer extends to the outer circumferential drift region 32b, and concurrently therewith, the portion of each low concentration region 42 adjacent to its corresponding high concentration region 40 on the outer circumferential side is also depleted. When the depletion layer spreads in the outer circumferential voltage withstanding region 22, potential difference is generated in the depletion layer. In the vicinity of the upper surface 12a of the semiconductor substrate 12, an inner circumferential end of the outer circumferential voltage withstanding region 22 takes substantially a same potential as the upper electrode 14, and an outer circumferential end of the outer circumferential voltage withstanding region 22 (i.e., outer circumferential end surface 12c of the semiconductor substrate 12) takes substantially a same potential as the lower electrode 16. Due to this, in the outer circumferential voltage withstanding region 22, a potential difference is generated in the lateral direction (direction from the inner circumferential side toward the outer circumferential side). Notably, as no potential difference is generated within each high concentration region 40 that is not depleted, the potential difference is generated between the high concentration regions 40 in the respective guard rings 36.

Figure 5:
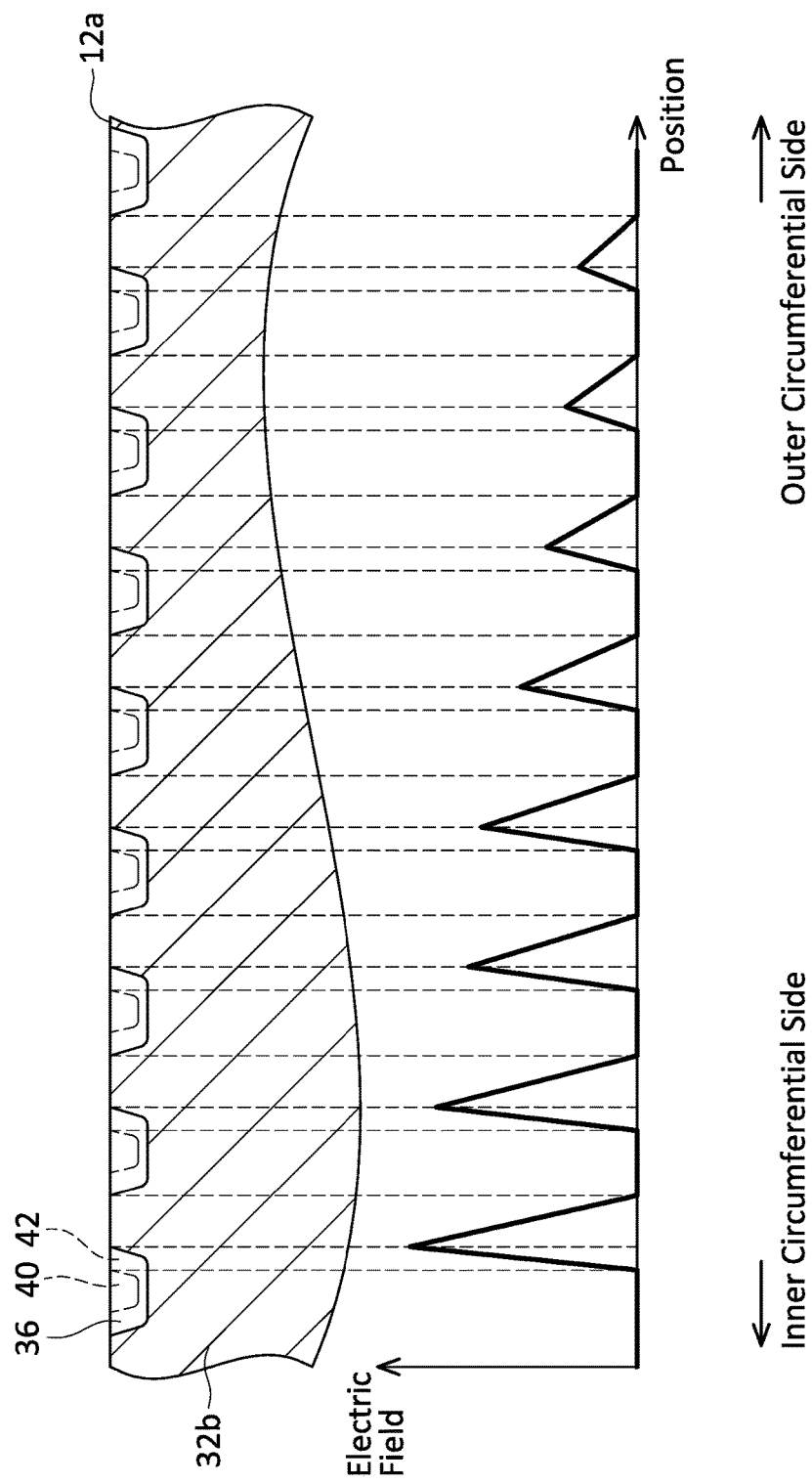
FIG. 5 shows a structure and an electric field distribution of an outer circumferential voltage withstanding region of a semiconductor device according to a comparative example.

Here, an electric field distribution of a semiconductor device according to a comparative example shown in FIG. 5 will be considered. The upper part of FIG. 5 shows a configuration of guard rings 36 of the semiconductor device of the comparative example, and the lower part of FIG. 5 shows an electric potential distribution in the vicinity of the upper surface 12a of when reverse voltage is applied to the semiconductor device of the comparative example. In the configuration of FIG. 5, the widths of the respective guard rings 36 are the same as each other, the widths of the low concentration regions 42 are the same as each other, and the intervals between each pair of adjacent guard rings 36 are the same as each other. As mentioned above, since the portion of each low concentration region 42 that is adjacent to its corresponding high concentration region 40 on the outer circumferential side as well as the outer circumferential drift region 32b are depleted, electric filed is generated in these depleted regions. In each of regions where electric field is generated (each depleted region), the electric field peaks at the corresponding pun junction (interface between each guard ring 36 and the outer circumferential drift region 32b), and the electric field shrinks as it gets farther away from the pn junction. A reason why the electric field is distributed in this manner is because fixed charges having different polarities exist in the depleted regions at both sides of each pn junction (each portion of the depleted outer circumferential drift region 32b and each depleted low concentration region 42). Further, each of values obtained by integrating the graph of FIG. 5 (i.e., area of each triangle depicted by the graph) indicates a potential difference generated between each pair of adjacent high concentration regions 40. As shown in FIG. 5, in the semiconductor device of the comparative example, the potential differences generated between respective pairs of adjacent high concentration regions 40 become greater toward the inner circumferential side and smaller toward the outer circumferential side. Further, since the respective depletion layers extending in regions between pairs of the adjacent high concentration regions 40 have substantially the same width, a size of the electric field generated in the region between each pair of adjacent high concentration regions 40 is substantially proportional to the potential difference of the same region. Due to this, the generated potential difference increases toward the inner circumferential side. Therefore, with this configuration, avalanche breakdown is more likely to occur in vicinities of the guard ring(s) 36 on the inner circumferential side. Further, it is likely that the electric field becomes high at a surface of the insulating film 18 above each of the guard ring(s) 36 on the inner circumferential side and creeping discharge (discharge of electricity from the upper electrode 14 to the lower electrode 16 creeping through the surface of the insulating film 18 and the outer circumferential end surface 12c) occurs.

Figure 6:
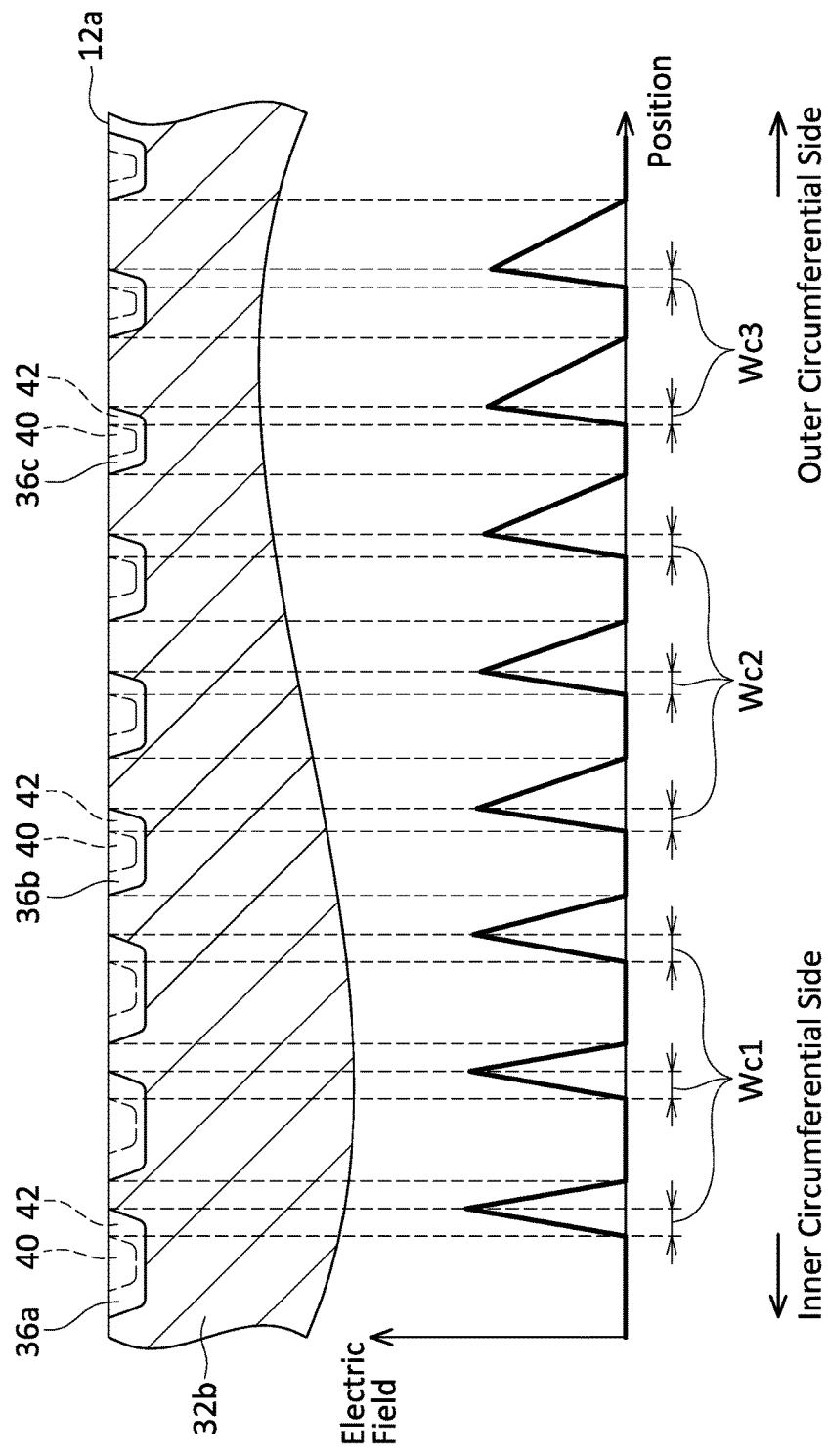
FIG. 6 shows a structure and an electric field distribution of an outer circumferential voltage withstanding region of the semiconductor device according to the embodiment.
Figure 7:
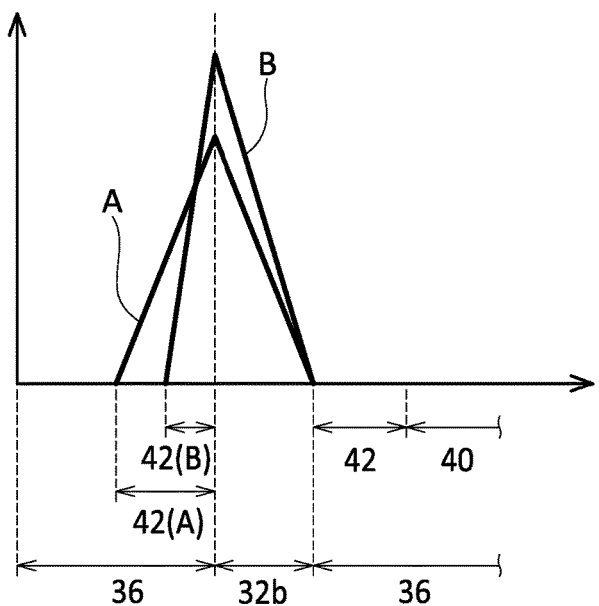
FIG. 7 shows a relation between widths of low concentration regions and the electric field distribution.

On the other hand, FIG. 6 indicates an electric potential distribution in the vicinity of the upper surface 12a. of when reverse voltage is applied to the semiconductor device 10 according to the present-embodiment. As shown in the lower part of FIG. 6, in the semiconductor device 10 according to the present embodiment, there is not significant difference between the guard rings 36 on the inner circumferential side and the guard rings 36 on the outer circumferential side in potential difference (i.e., an area of each triangle depicted by the graph) occurring between the corresponding high concentration regions 40 in each pair of the adjacent guard rings 36. This is because the widths of the guard rings 36 (Wa1, Wa2, Wa3 (see FIG. 3)) become greater toward the inner circumferential side, and the intervals between pairs of the guard rings 36 (Wb1, Wb2, Wb3 (see FIG. 3)) become narrower toward the inner circumferential side. Thus, in the semiconductor device according to the present embodiment shown in FIG. 6, the potential differences are equalized at a greater degree than in the case of FIG. 5, as a result of which electric field concentration on the inner circumferential side can be suppressed to some extent. However, high electric field may still occur in the vicinity of the guard ring(s) 36 on the inner circumferential side merely with just the adjustment of the widths and the intervals of the guard rings 36. To this end, in the guard rings 36 of the semiconductor device 10 according to the present embodiment, the widths of the portions of the respective low concentration regions 42 adjacent to their corresponding high concentration regions 40 decrease toward the outer circumferential side. As mentioned above, this portion of each low concentration region 42 is depleted. Due to this, in the guard ring(s) 36 on the inner circumferential side, the width of the depletion layer becomes wider by the amount by which the width of this portion of the corresponding low concentration region 42 is widened. As a result of this, a range where the electric field is distributed increases and thus the peak of the electric field decreases. For example, FIG. 7 shows an electric field distribution between two guard rings 36 and graph A indicates a case where the width of the portion of the low concentration region 42 adjacent to its corresponding high concentration region 40 on the outer circumferential side is wide, while graph B indicates a case where the width of the same portion is narrow. The potential differences generated between the adjacent guard rings 36 (i.e., area of each triangle depicted by the graph A, B) are equal between graphs A and B. As the potential differences generated in the graphs A and B are equal, the peak of the electric field in the graph A is lower than the peak of the electric field in the graph B by an amount by which the width of the low concentration region 42 (i.e., region to be depleted) is greater in graph A than in graph B. Thus, high electric field is less likely to occur with a greater width for the portion of each low concentration region 42 adjacent to the corresponding high concentration region 40 on the outer circumferential side. In the semiconductor device according to the present embodiment, since the widths (Wc1, Wc2, Wc3) of the low concentration regions 42 of the guard rings 36 increase toward the inner circumferential side, suppressing effect of the electric field is high in the vicinities of the guard ring(s) 36 on the inner circumferential side. As a result, as shown in FIG. 6, the electric fields in the vicinities of the respective guard rings 36 are equalized between the inner circumferential side and the outer circumferential side. The configuration according to the present embodiment allows for further improved withstanding voltage.

Further, as mentioned above, in the semiconductor device 10 according to the present embodiment, the width Wc4 of its low concentration regions 42 of the main p-type region 34 in the element region 20 is small. As mentioned above, potential difference is barely generated in the lateral direction in the element region 20, and therefore, despite the width Wc4 of the low concentration region 42 being small, the problem of high electric field does not occur. Further, by setting the width Wc4 of the low concentration region 42 to be small, a contact area between the main drift region 32a and the upper electrode 14 (area of the Schottky interface) can be increased. This allows for improved performance of the SBD.

Figure 8:
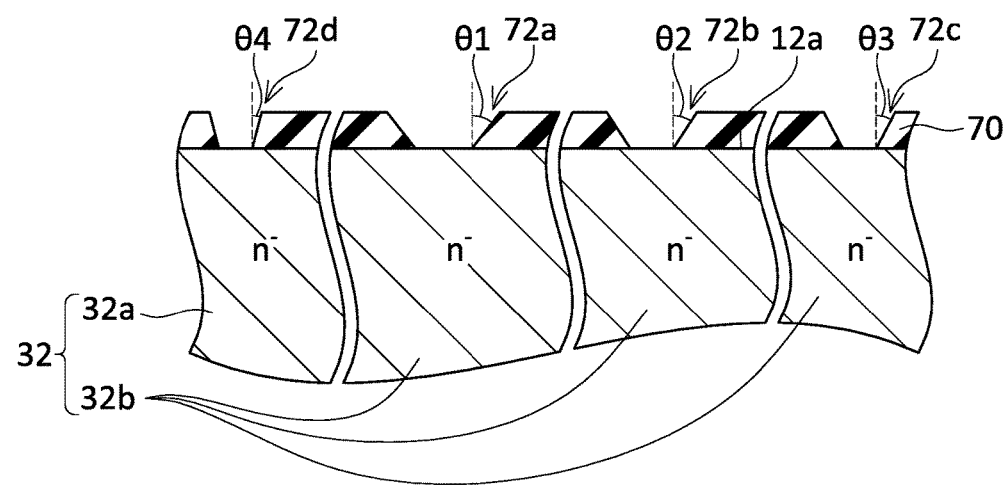
FIG. 8 shows an explanatory diagram of a manufacturing method of the semiconductor device according to the embodiment.
Figure 9:
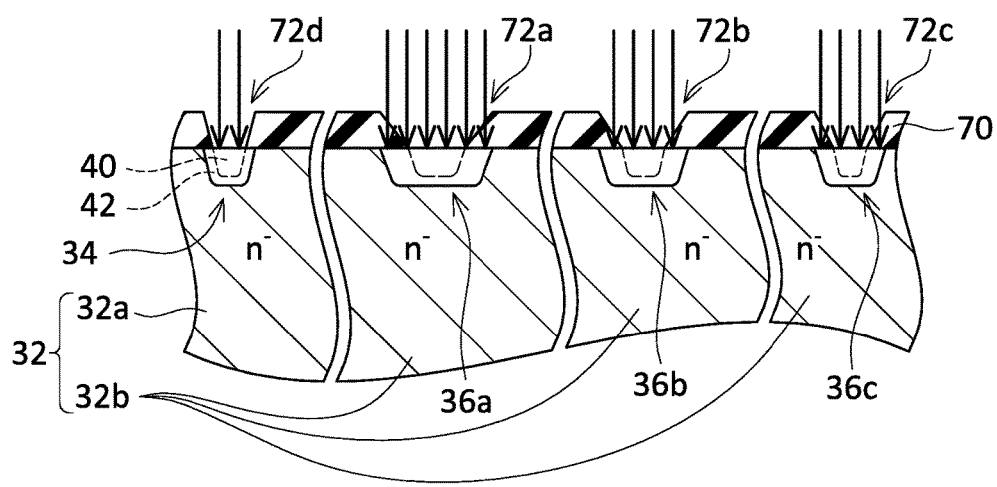
FIG. 9 shows an explanatory diagram of the manufacturing method of the semiconductor device according to the embodiment.

Next, a manufacturing method of the semiconductor device 10 will be described. Notably, since this manufacturing method has characterizing features in processes for forming the guard rings 36 and the main p-type region 34, these processes will be mainly described hereinbelow. Firstly, as shown in FIG. 8, a mask 70 (e.g., silicon oxide film) is formed on a surface of the drift region 32 of a semiconductor wafer, and subsequently openings 72a to 72d are formed in the mask 70. The openings 72a to 72d may be formed by selective etching. The openings 72a to 72d may be concurrently formed in one same process, and alternatively may be formed in separate processes. The opening 72a is formed above an area in which a first guard ring 36a is to be formed, the opening 72b is formed above an area in which a second guard ring 36b is to be formed, the opening 72c is formed above an area in which a third guard ring 36c is to be formed, and the opening 72d is formed above an area in which the main p-type region 34 is to be formed. At this occasion, inclination angles of side surfaces of the openings 72a to 72d are adjusted by adjusting etching conditions. Notably, the inclination angle of the side surface means an angle of the side surface relative to a perpendicular line to the upper surface 12a of the semiconductor substrate 12. Here, inclination angle θ1 of the side surface of each opening 72a, inclination angle θ2 of the side surface of each opening 72b, inclination angle θ3 of the side surface of each opening 72c, and inclination angle θ4 of the side surface of each opening 72d are adjusted such that they satisfy θ1>θ2>θ3>θ4. Further, the widths of the respective openings are adjusted such that each opening 72a is widest, each opening 72b is wider than each of openings 72c, 72d, and each opening 72c is wider than each opening 72d. Next, as shown in FIG. 9, p-type impurities are implanted into the semiconductor substrate 12 via the mask 70. In each opening, the p-type impurities are directly implanted into the semiconductor substrate 12. Due to this, the high concentration regions 40 are formed in the respective openings. Moreover, a part of the p-type impurities entered in the inclined side surface of each opening is implanted to the semiconductor substrate 12 by penetrating the mask 70. Due to this, in a region located on a backside of the inclined side surface of each opening, the p-type impurities are also implanted at a low concentration. Thus, the low concentration regions 42 are formed on the backsides of the side surfaces of the respective openings. The width of each low concentration region 42 increases with a greater inclination angle of the side surface of the corresponding opening. Therefore, as shown in FIGS. 3 and 4, among the first guard rings 36a, the second guard rings 36b, the third guard rings 36c, and the main p-type region 34, the respective widths of the low concentration regions 42 satisfy Wc1>Wc2>Wc3>Wc4. According to this manufacturing method, the semiconductor device 10 can be easily manufactured.

It should be noted, in the above embodiment, an SBD is formed in the element region 20, but alternatively another type of semiconductor element may be provided in the element region 20. For example, a pn diode may be provided in the element region where the upper electrode 14 serves as an anode electrode and the lower electrode 16 serves as a cathode electrode. Also when the pn diode is provided, similarly to the present embodiment, electronic field can be suppressed in the outer circumferential voltage withstanding region when reverse voltage is applied. Further alternatively, a MOSFET (Metal Oxide Semiconductor Field Effect Transistor) may be provided in the element region where the upper electrode 14 serves as a source electrode, the lower electrode 16 serves as a drain electrode, and further a gate electrode is provided. Further alternatively, an IGBT (Insulated Gate Bipolar Transistor) may be provided in the element region where the upper electrode 14 serves as an emitter electrode, the lower electrode 16 serves as a collector electrode, and further a gate electrode is provided. In cases of the MOSFET or IGBT, electric field can be suppressed when these semiconductor elements are turned off.

Further, in the above embodiments, in each guard ring 36, the width of the portion of the low concentration region 42 adjacent to its corresponding high concentration region 40 on the outer circumferential side is equal to the width of the portion of the low concentration region 42 adjacent to its corresponding high concentration region 40 on the inner circumferential side. However, so long as the widths of the portions of the respective low concentration regions 42 adjacent to the corresponding high concentration regions 40 on the outer circumferential side satisfy Wc1>Wc2>Wc3, the widths of the portions of the respective low concentration regions 42 adjacent to the corresponding high concentration regions 40 on the inner circumferential side may take any value.

Relations between the respective constituent features in the above embodiments and respective constituent features in the claims will be described. The first guard rings 36a of the embodiments are an example of an inner circumferential guard ring in the claims. The third guard rings 36c of the embodiments are an example of an outer circumferential guard ring in the claims. The second guard rings 36b of the embodiments are an example of the outer circumferential guard ring in relation to the first guard rings 36a, but are an example of the inner circumferential guard ring in relation to the third guard rings 36c. The respective portions extending in stripes in the main p-type region are an example of a contact p-type region in the claims.

Some of the features characteristic to below-described embodiments will herein be listed. It should be noted that the respective technical elements are useful independently.

In one configuration example disclosed herein, the element region may further comprise: a plurality of contact p-type regions being in contact with the front surface electrode and extending in stripe shapes with intervals therebetween; an n-type main drift region being in Schottky contact with the front surface electrode at positions between the plurality of contact p-type regions; and an n-type cathode region being in ohmic contact with the rear surface electrode and being in contact with the main drift region, each of the contact p-type regions comprises: a third high concentration region having a p-type impurity concentration that is higher than ten percent of a peak value of a p-type impurity concentration of the contact p-type region; and a third low concentration region having a p-type impurity concentration that is equal to or lower than ten percent of the peak value of the p-type impurity concentration of the contact p-type region and located between the corresponding third high concentration region and the main drift region, and a width of a portion of each third low concentration region is narrower than the width of the portion of each second low concentration region, the portion of each third low concentration region being exposed on the front surface.

In the above configuration, a Schottky bather diode is configured by the front surface electrode, the main drift region, the cathode region, and the rear surface electrode. When reverse voltage is applied to the Schottky barrier diode, a depletion layer spreads from each contact p-type region to the main drift region. Due to this, electric field concentration in the element region is suppressed. In the element region, a potential difference is generated in the thickness direction (vertical direction) of the semiconductor substrate, and a potential difference is hardly generated in the lateral direction. For this reason, in the element region, electric field concentration is not generated in the lateral direction. Therefore, even if the width of the third low concentration region in each main contact p-type region is narrowed, that would not be a problem. Further, it becomes possible to widen an area of a Schottky interface (contact surface between the main drift region and the front surface electrode) by narrowing the width of the third low concentration region in each main p-type region, leading to an improved performance of the Schottky barrier diode.

The semiconductor device disclosed herein may be manufactured by a manufacturing method of a semiconductor device exemplified hereinbelow. The method may comprise: forming a mask on a front surface of a semiconductor wafer, the mask comprising inner circumferential openings and outer circumferential openings; forming the inner circumferential guard rings by implanting p-type impurities to the front surface of the semiconductor wafer within the inner circumferential openings and forming the outer circumferential guard rings by implanting p-type impurities to the front surface of the semiconductor wafer within the outer circumferential openings, wherein an inclination angle of a lateral surface of each inner circumferential side opening is larger than an inclination angle of a lateral surface of each outer circumferential opening.

In the implantation of the p-type impurities, if the side surface of an opening is inclined, the p-type impurities are implanted into the semiconductor substrate, penetrating the side surface. In a region where the p-type impurities have been implanted in this manner, a low concentration region having a low p-type impurity concentration is formed. In the above manufacturing method, in the outer circumferential side opening of which inclination angle of its side surface is great, a low concentration region having a greater width than an inner circumferential side opening of which inclination angle of its side surface is small. Consequently, according to this manufacturing method, the width of the first low concentration region of the inner circumferential guard ring can be made greater than the width of the second low concentration region of the outer circumferential guard ring.

While specific examples of the present invention have been described above in detail, these examples are merely illustrative and place no limitation on the scope of the patent claims. The technology described in the patent claims also encompasses various changes and modifications to the specific examples described above. The technical elements explained in the present description or drawings provide technical utility either independently or through various combinations. The present invention is not limited to the combinations described at the time the claims are filed. Further, the purpose of the examples illustrated by the present description or drawings is to satisfy multiple objectives simultaneously, and satisfying any one of those objectives gives technical utility to the present invention.

What is claimed is:

1. A semiconductor device, comprising:
 a semiconductor substrate;
 a front surface electrode being in contact with a front surface of the semiconductor substrate;
 a rear surface electrode being in contact with a rear surface of the semiconductor substrate,
 wherein
 the semiconductor substrate comprises:
 an element region overlapping with a contact surface between the front surface electrode and the semiconductor substrate in a planar view along a thickness direction of the semiconductor substrate, and comprising a semiconductor element configured to electrically connect the front surface electrode and the rear surface electrode; and
 a peripheral voltage withstanding region located around the element region and comprising:
 a plurality of p-type guard rings exposed on the front surface and surrounding the element region in a pattern of layers of rings; and
 an n-type peripheral drift region separating the plurality of guard rings from each other,
 wherein the plurality of guard rings comprises:
 a plurality of inner circumferential guard rings; and
 a plurality of outer circumferential guard rings located on an outer circumferential side with respect to the inner circumferential guard rings and having a width narrower than a width of the inner circumferential guard rings,
 an interval between the inner circumferential guard rings is narrower than an interval between the outer circumferential guard rings,
 wherein each of the inner circumferential guard rings comprises:
 a first high concentration region having a p-type impurity concentration that is higher than ten percent of a peak value of a p-type impurity concentration of the inner circumferential guard ring; and
 a first low concentration region having a p-type impurity concentration that is equal to or less than ten percent of the peak value of the p-type impurity concentration of the inner circumferential guard ring and located between the corresponding first high concentration region and the peripheral drift region, each of the outer circumferential guard rings comprises:

a second high concentration region having a p-type impurity concentration that is higher than ten percent of a peak value of a p-type impurity concentration of the outer circumferential guard ring; and a second low concentration region having a p-type impurity concentration that is equal to or lower than ten percent of the peak value of the p-type impurity concentration of the outer circumferential guard ring and located between the corresponding second high concentration region and the peripheral drift region, and a width of a portion of each first low concentration region is wider than a width of a portion of each second low concentration region, the portion of each first low concentration region being exposed on the front surface and being adjacent to the corresponding first high concentration region on the outer circumferential side, and the portion of each second low concentration region being exposed on the front surface and being adjacent to the corresponding second high concentration region on the outer circumferential side.

2. The semiconductor device of claim 1, wherein the element region further comprises:

a plurality of contact p-type regions being in contact with the front surface electrode and extending in stripe shapes with intervals therebetween;

an n-type main drift region being in Schottky contact h front surface electrode at positions between the plurality of contact p-type regions; and an n-type cathode region being in ohmic contact with the rear surface electrode and being in contact with the main drift region, each of the contact p-type regions comprises:

a third high concentration region having a p-type impurity concentration that is higher than ten percent of a peak value of a p-type impurity concentration of the contact p-type region; and a third low concentration region having a p-type impurity concentration that is equal to or lower than ten percent of the peak value of the p-type impurity concentration of the contact p-type region and located between the corresponding third high concentration region and the main drift region, and a width of a portion of each third low concentration region is narrower than the width of the portion of each second low concentration region, the portion of each third low concentration region being exposed on the front surface.

3. A method of manufacturing the semiconductor device of claim 1, the method comprising:

forming a mask on a front surface of a semiconductor wafer, the mask comprising inner circumferential openings and outer circumferential openings;

forming the inner circumferential guard rings by implanting p-type impurities to the front surface of the semiconductor water within the inner circumferential openings and forming the outer circumferential guard rings by implanting p-type impurities to the front surface of the semiconductor wafer within the outer circumferential openings, wherein an inclination angle of a lateral surface of each inner circumferential opening is larger than an inclination angle of a lateral surface of each outer circumferential opening.

* * * * *